April 2, 1963 B. P. WILLIAMS 3,084,266
MONOSTABLE MULTIVIBRATOR USING EMITTER-FOLLOWER FEEDBACK TIMING CIRCUIT
Filed May 27, 1960
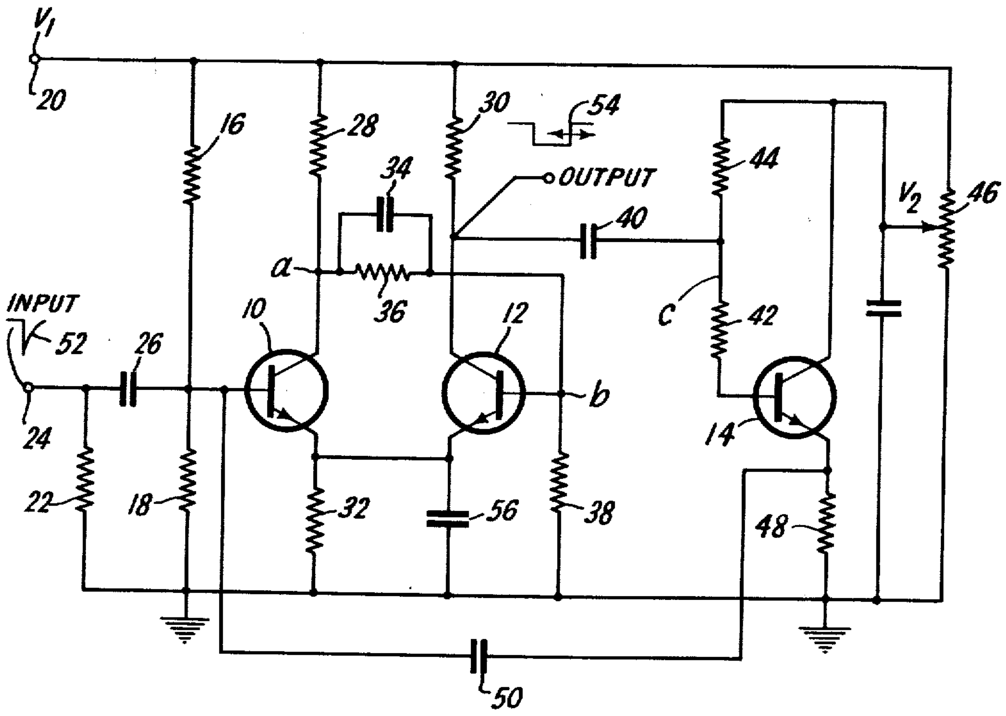
INVENTOR
BRUCE P. WILLIAMS
BY Spencer E. Olson
ATTORNEY United States Patent Office 3,084,266

Patented Apr. 2, 1963

3,084,266

MONOSTABLE MULTIVIBRATOR USING EMITTER-FOLLOWER FEEDBACK TIMING CIRCUIT

Bruce P. Williams, Williamsville, N.Y., assignor to Sylvania Electric Products Inc., a corporation of Delaware Filed May 27, 1960, Ser. No. 32,314
4 Claims. (Cl. 307—88.5)

This invention relates to pulse forming networks, and is more particularly concerned with a circuit for producing an output pulse, in response to application of a trigger pulse, having a pulse width proportional to the amplitude of a control voltage.

There is a frequent requirement in pulse circuitry to introduce a finite delay between the occurrence of one pulse and the initiation of another pulse, which delay is preferably also controllable in length. Such circuits moreover, desirably should have good time stability from cycle to cycle. One circuit which has long been available for this purpose is the so-called phantastron circuit which produces an output pulse, upon application of a trigger, whose width is proportional to the amplitude of a control voltage. The success of the conventional phantastron circuit is largely due to the utilization of a multi-electrode vacuum tube, usually a heptode, in combination with a Miller timing circuit. In the operation of this circuit, the time base is initiated by a trigger applied to the control grid of the tube, and a square wave output appearing at the screen grid and a linearly varying signal appearing at the plate. The associated circuitry is such that it supplies its own gate, and hence the circuit operation is analogous to that of the plate-coupled monostable multivibrator. The delay afforded by the circuit is adjustable by controlling the voltage from which the discharge of the capacitor of the Miller circuit begins.

The phantastron has the disadvantage of requiring a vacuum tube, as above mentioned, and the rather high operating voltages attendant the use of vacuum tubes. In addition, a relatively large control voltage is required. Thus, in applications where size and weight considerations are controlling, the vacuum tube circuit and its associated power supplies may not be satisfactory.

It is the primary object of the present invention to provide a transistorized pulse forming network having characteristics similar to that of the phantastron.

Another object of the invention is to provide a transistorized pulse forming network of simple design and requiring small voltage supplies, for accurately providing controllable time delays.

In the attainment of the foregoing objects, the circuit of the present invention features the use of three transistors combined in a unique manner to provide a controllable time delay in response to a trigger pulse. In general, two of the transistors are connected as a monostable multivibrator with the third transistor connected in a controlled variable charge feedback loop between the collector of one of the transistors of the multivibrator to the base of the other transistor. The amplitude of the feedback signal, which is determined by a variable control voltage, and a capacitor in the feedback path, determine the duration of the output pulse, and hence the delay, of the circuit.

Other objects, features and advantages of the circuit, and a better understanding of its operation, will be had from the following detailed description taken in conjunction with the accompanying drawing, the single FIGURE of which is a schematic diagram of a preferred embodiment of the pulse forming circuit according to the invention.

Referring to the drawing, the circuit includes three transistors 10, 12 and 14 of the NPN type to enable their being triggered into conduction by a positive going signal or, if already conducting, turned off by a negative-going signal. In the quiescent condition, transistor 10 is conducting, transistor 12 is non-conducting, and transistor 14, connected as an emitter follower, is conducting. Transistor 10 is biased to be normally conducting by a voltage divider including resistors 16 and 18 connected between a source of positive potential $V_1$, represented by terminal 20, and ground. Inasmuch as resistor 18 to some degree affects the time constant and hence the pulse width of the circuit, and loading of the input trigger pulse, its value for a particular application is preferably selected first, and thereafter a value of resistor 16 chosen for appropriate voltage division to give the proper bias at the base of transistor 10. In a circuit which has been successfully operated, the base of transistor 10 was biased 0.7 volt positive with respect to the emitter of the transistor. A resistor 22 having a value to properly terminate the input trigger circuit is connected between the input terminal and ground, and a coupling capacitor 26 isolates the bias potential at the junction of resistors 16 and 18 from the pulse circuitry coupled to terminal 24.

The collector current of transistor 10 is limited by resistor 28, the value of which is determined by the rating of the transistor used. The collector of transistor 12 is also connected to the source of potential 20 through resistor 30 whose value is determined by the current capacity of transistor 12. The emitters of transistors 10 and 12 are connected together and through a common emitter resistor 32 to ground. The collector of transistor 10 (point *a*) is coupled to the base of transistor 12 (point *b*) through the parallel combination of capacitor 34 and resistor 36. Capacitor 34 is provided to couple the rise and decay portions of the pulse, while the resistor 36 maintains the D.C. level. Connected between the base of transistor 12 and ground is a resistor 38 having a value to set the bias at point *b* such that when transistor 10 is conducting the voltage at point *b* will be below the voltage at the emitter of transistor 12 so as to cut off transistor 12. Since the emitters of transistors 10 and 12 are connected together, the voltage on both emitters is the same and is caused by the voltage drop in resistor 32 due to the current in transistor 10.

The output of transistor 12 is developed across resistor 30 and is coupled through capacitor 40 and resistor 42 to the base of transistor 14. The function of capacitor 40 is to isolate the direct current levels existing between the collector of transistor 12 and the junction of capacitor 40 and resistor 42 (point *c*), and should have a value large enough to pass the lowest frequencies contained in the widest pulse to be generated by the circuit. Resistor 42 limits the base current of transistor 14 to the maximum allowable for the transistor used, and in order to minimize the base current it is preferable to use a transistor having a high beta. Point *c* is also connected through resistor 44 to a source of potential having a value designated $V_2$. The potential $V_2$ is controllable in magnitude and may be obtained from the movable tap of a potentiometer 46 connected between terminal 20 and ground. Resistor 44 holds the base of transistor 14 at the voltage $V_2$ in the absence of signals, and should be of a value sufficiently large as to not differentiate the pulse from capacitor 40. The collector of transistor 14 is also connected to the source of voltage $V_2$, and the emitter is connected through resistor 48 to ground, the value being compatible with the current limitations of transistor 14. With this arrangement, the potential observed at the emitter of transistor 14 will be the potential at point *c* less the voltage drop in transistor 14; in a practical circuit, this drop should be no more than 0.8 volt. Should the voltage at point *c* be higher than $V_2$, then the latter will limit the potential at the emitter of transistor 14. Transistor 14 is connected as an emitter follower, the signal developed across resistor 48 being coupled back through capacitor 50 to the base of transistor 10. The discharge rate of capacitor 50 is the principal time constant determinant of the circuit. The voltage coupled back through capacitor 50 is an in-phase positive feedback, thereby to hold transistor 10 non-conductive during the time of discharge af capacitor 50. This action effectively stretches the output pulse, which is derived from the collector of transistor 12, the duration depending on the capacitance of capacitor 50 and the magnitude of the signal at the emitter of transistor 14 from which discharge begins. The larger the signal at the emitter of transistor 14, the longer it takes capacitor 50 to follow, and, consequently, the greater the pulse stretching.

The operation of the circuit will be understood by following a pulse through the circuitry. Initially, it will be assumed that the tap on potentiometer 46 is at the upper end whereby $V_2$ is equal to $V_1$. Recalling that transistor 10 is normally conducting, a negative trigger pulse 52 having a pulse width (about one microsecond) and amplitude necessary to trigger the circuitry is applied to the input terminal 24. Alternatively, a positive trigger can be used if differentiated by capacitor 26. The trigger pulse turns off transistor 10 causing the potential at point *a* to go positive. This positive going signal is conducted to the base of transistor 12, which is normally non-conducting, causing the latter to go into conduction. As a result, the collector of transistor 12 goes negative, this negative pulse being coupled to the base of transistor 14 through capacitor 40 and limiting resistor 42. This negative pulse is reproduced across resistor 48 with its amplitude equal to that of the negative pulse at point *c* less the drop through resistor 42 and transistor 14, this drop being very small for high beta transistors. The negative pulse as seen across resistor 48 can never exceed the value $V_2$ in amplitude regardless of the amplitude of the pulse at the collector of transistor 12. With the potential $V_2$ equal to $V_1$, the entire pulse at the collector of transistor 12 is reproduced across resistor 48. On the other hand, if $V_2$ is equal to zero, no pulse is reproduced across resistor 48. Therefore, by varying $V_2$ the amplitude of the pulse appearing across resistor 48 can be varied. This negative pulse, of controllable amplitude, is transferred to the base of transistor 10 through the feedback path including capacitor 50. The latter constitutes a closed loop positive feedback path and the time duration of the feedback is proportional to the charge on capacitor 50, which, in turn, is proportional to the pulse amplitude appearing across resistor 48. This pulse amplitude, in turn, is proportional to $V_2$. Accordingly, by varying the magnitude of $V_2$, the pulse duration may be varied. In a circuit which has been satisfactorily operated, a 12–1 change in pulse width has been obtained by varying the value of $V_2$ from $V_1$ to zero. The output pulse 54, having a substantially rectangular wave form, is taken from the collector of transistor 12.

Because the charge curve of capacitor 50 is not completely linear over the possible range of values of $V_2$, in applications where better linearity is required some compensation may be necessary. It has been found that improved linearity can be obtained by providing some feedback between the emitters of transistors 10 and 12 by connecting capacitor 56 in parallel with resistor 32. The value of capacitor 56 is selected for best over-all operating results, a value of 0.02 microfarad having been found satisfactory.

From the foregoing it is seen that applicant has achieved the above-stated objects of providing a transistorized circuit of simple design and small size for producing, in response to either a positive or negative trigger signal, an output pulse having a width proportional to a controllable voltage $V_2$ and of substantially constant amplitude.

Although there has been described what is now considered a preferred embodiment of the invention, various modifications will now be suggested to ones skilled in the art. It is the intention, therefore, that the invention shall not be limited by the description except as set forth in the following claims.

What is claimed is:

1. A pulse-forming network comprising, in combination, first, second and third transistors each having base, emitter and collector electrodes, means connecting the emitter electrodes of said first and second transistors to a source of reference potential, means including a parallel combination of a resistor and a capacitor connected between the collector of said first transistor and the base of said second transistor interconnecting said first and second transistors as a monostable multivibrator, a source of direct current voltage of controllable magnitude connected to the collector of said third transistor, means coupling the collector of said second transistor to the base of said third transistor, and a feedback path including a capacitor connected between the emitter of said third transistor and the base of said first transistor.

2. A pulse-forming network for producing an output pulse of controllable duration in response to an input trigger pulse comprising, in combination, first, second and third transistors each having base, collector and emitter electrodes, means connecting the emitter electrodes of said first and second transistors to a source of reference potential, means including a parallel combination of a resistor and a capacitor connected between the collector of said first transistor and the base of said second transistor interconnecting said first and second transistors as a monostable multivibrator, means for applying said input trigger pulse to the base of said first transistor, means coupling the collector of said second transistor to the base of said third transistor, a source of direct current voltage of controllable width comprising, in combination, first, second third transistor, and a feedback path including a capacitor connected between the emitter of said third transistor and the base of said first transistor for applying in-phase positive feedback voltage to the base of said first transistor.

3. A pulse-forming network for producing an output pulse of a controllable duration in response to an input trigger pulse comprising, in combination, first, second and third transistors ecah having base, collector and emitter electrodes, means connecting the emitters of said first and second transistors through a common resistor to a source of reference potential, a parallel combination of a first resistor and a first capacitor connecting the collector of said first transistor to the base of said second transistor, means connecting the collectors of said first and second transistors through separate resistors to a first source of positive potential, means for applying said input trigger pulse to the base of said first transistor, a second source of positive potential controllable in magnitude between the magnitude of said first source of potential and said reference potential connected to the collector of said third transistor, a second resistor connected between the emitter of said third transistor and said source of reference potential, third and fourth resistors serially connected between said second source of potential and the base of said third transistor, a second capacitor connected between the collector of said second transistor and the junction of said third and fourth resistors, a feedback path including a third capacitor connected between the emitter of said third transistor and the base of said first transistor for applying in-phase positive feedback to the base of said first transistor, and means connected to the collector of said second transistor for deriving said output pulse.

4. A generator for producing output pulses of controllable width comprising, in combination, first, second and third transistors each having base, collector, and emitter electrodes, means connecting the emitter electrodes of said first and second transistors through a common first resistor to a source of reference potential, a parallel combination of a second resistor and a first capacitor connecting the collector of said first transistor to the base of said second transistor, means connecting the collectors of said first and second transistors to a source of positive potential, means for applying a trigger pulse to the base electrode of said first transistor, means including a second capacitor connecting the collector of said second transistor to the base of said third transistor, means connecting the emitter of said third transistor through a third resistor to said source of reference potential, a third capacitor connected between the emitter of said third transistor and the base of said first transistor, and means for establishing a collector potential of controllable value on said third transistor.

References Cited in the file of this patent

UNITED STATES PATENTS 2,970,226 Skelton ---------------- Jan. 31, 1961
2,976,427 Armanini -------------- Mar. 21, 1961

UNITED STATES PATENT OFFICE

CERTIFICATE OF CORRECTION

Patent No. 3,084,266 April 2, 1963

Bruce P. Williams

It is hereby certified that error appears in the above numbered patent requiring correction and that the said Letters Patent should read as corrected below.

Column 3, line 5, for "af" read -- of --; column 4, line 33, for "width comprising, in combination, first, second" read -- magnitude connected to the collector of said --; line 41, for "ecah" read -- each --.

Signed and sealed this 5th day of November 1963.

(SEAL)
Attest:

ERNEST W. SWIDER
Attesting Officer

EDWIN L. REYNOLDS
Acting Commissioner of Patents